(12) United States Patent
Gotanda et al.

(10) Patent No.: US 10,090,468 B2
(45) Date of Patent: Oct. 2, 2018

(54) PHOTOELECTRIC CONVERSION ELEMENT AND METHOD FOR MANUFACTURING THE SAME

(71) Applicant: Kabushiki Kaisha Toshiba, Minato-ku (JP)

(72) Inventors: Takeshi Gotanda, Yokohama (JP); Hyangmi Jung, Yokohama (JP); Atsuko Iida, Yokohama (JP); Mitsunaga Saito, Inzai (JP); Yoshihiko Nakano, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/070,776

(22) Filed: Mar. 15, 2016

(65) Prior Publication Data

US 2016/0285022 A1    Sep. 29, 2016

(30) Foreign Application Priority Data

Mar. 25, 2015 (JP) ................... 2015-061830

(51) Int. Cl.
*H01L 31/042* (2014.01)
*H02N 6/00* (2006.01)
(Continued)

(52) U.S. Cl.
CPC ...... *H01L 51/0012* (2013.01); *H01L 51/4233* (2013.01); *H01L 51/4273* (2013.01);
(Continued)

(58) Field of Classification Search
CPC ............. H01L 51/0012; H01L 51/4233; H01L 51/4273; H01L 2251/308; H01L 51/0043;
(Continued)

(56) References Cited

U.S. PATENT DOCUMENTS 5,593,901 A * 1/1997 Oswald ............ H01L 31/02242
                                                    136/244
2005/0043888 A1    2/2005 Kang
(Continued)

FOREIGN PATENT DOCUMENTS

JP    2001-85722    3/2001
JP    2005-33006    2/2005
(Continued)

OTHER PUBLICATIONS

Lattante, "Electron and Hole Transport Layers: Their Use in Inverted Bulk Heterojunction Polymer Solar Cells," Electronics 2014, 3, 132-164; doi:10.3390/electronics3010132.*
(Continued)

*Primary Examiner* — Angelo Trivisonno
(74) *Attorney, Agent, or Firm* — Oblon, McClelland, Maier & Neustadt, L.L.P.

(57) ABSTRACT

According to one embodiment, a photoelectric conversion element includes a first electrode, a second electrode, a photoelectric conversion layer and a first layer. The photoelectric conversion layer is provided between the first electrode and the second electrode. The first layer is provided between the first electrode and the photoelectric conversion layer. The first layer includes at least a first metal oxide. The first layer has a plurality of orientation planes. At least one of the orientation planes satisfies the relationship $L1>L2$, where $L1$ is a length of the one of the plurality of orientation planes, and $L2$ is a thickness of the first layer along a first direction. The first direction is from the first electrode toward the second electrode.

14 Claims, 10 Drawing Sheets

(51) Int. Cl.
*H01L 51/00* (2006.01)
*H01L 51/42* (2006.01)
*H01L 31/0256* (2006.01)

(52) U.S. Cl.
CPC .. *H01L 51/0043* (2013.01); *H01L 2031/0344* (2013.01); *H01L 2251/303* (2013.01); *H01L 2251/308* (2013.01); *Y02E 10/549* (2013.01); *Y02P 70/521* (2015.11)

(58) Field of Classification Search
CPC ....... H01L 2251/303; H01L 2031/0344; Y02P 70/521; Y02E 10/549
See application file for complete search history.

(56) References Cited

U.S. PATENT DOCUMENTS

| | | |
|---|---|---|
| 2010/0304177 A1 | 12/2010 | Yoshida et al. |
| 2013/0233382 A1 | 9/2013 | Kobayashi et al. |
| 2014/0150868 A1 | 6/2014 | Ichibayashi et al. |

FOREIGN PATENT DOCUMENTS

| | | |
|---|---|---|
| JP | 2005-62185 | 3/2005 |
| JP | 2005-99939 | 4/2005 |
| JP | 2005-222384 | 8/2005 |
| JP | 2009-7668 | 1/2009 |
| JP | 2009-99435 | 5/2009 |
| JP | 2011-155155 | 8/2011 |
| JP | 2012-99646 A | 5/2012 |
| JP | 2013-4550 A | 1/2013 |
| JP | 2013-16667 | 1/2013 |
| JP | 2013-55216 | 3/2013 |
| JP | 2013-58714 | 3/2013 |
| JP | 2013-77749 | 4/2013 |
| JP | 2013-222750 | 10/2013 |
| JP | 2016-58455 | 4/2016 |

OTHER PUBLICATIONS

Pung et al., "Preferential growth of ZnO thin films by the atomic layer deposition technique," Nanotechnology, vol. 19, No. 43 (2008).*
Lattante, "Electron and Hole Transport Layers: Their Use in Inverted Bulk Heterojunction Polymer Solar Cells," Electronics 2014, 3, 132-164; doi:10.3390/electronics3010132 (Year: 2014).*
Pung et al., "Preferential growth of ZnO thin films by the atomic layer deposition technique," Nanotechnology, vol. 19, No. 43 (2008) (Year: 2008).*
Song Chen, et al., "Inverted Polymer Solar Cells with Reduced Interface Recombination", Advanced Energy Materials, 2, 2012, pp. 1333-1337.
M.H. Aslan, et al., "Preparation of c-axis-oriented zinc-oxide thin films and the study of their microstructure and optical properties", Solar Energy Materials & Solar Cells, 82, 2004, pp. 543-552.
Beng S. Ong, et al., "Stable, Solution-Processed, High-Mobility ZnO Thin-Film Transistors", J. Am. Chem. Soc., 129, JACS communications, 2007, pp. 2750-2751.
Dianyi Liu, et al., "Perovskite solar cells with a planar heterojunction structure prepared using room-temperature solution processing techniques", Nature Photonics, vol. 8, Feb. 2013, pp. 133-138 (supplementary information 6 pages).
Riccardo Po, et al., "The role of buffer layers in polymer solar cells", Energy & Environmental Science, The Royal Society of Chemistry, 4, 2011, pp. 285-310.
Office Action dated Feb. 4, 2016 in Japanese Patent Application No. 2015-061830 with English translation.

* cited by examiner

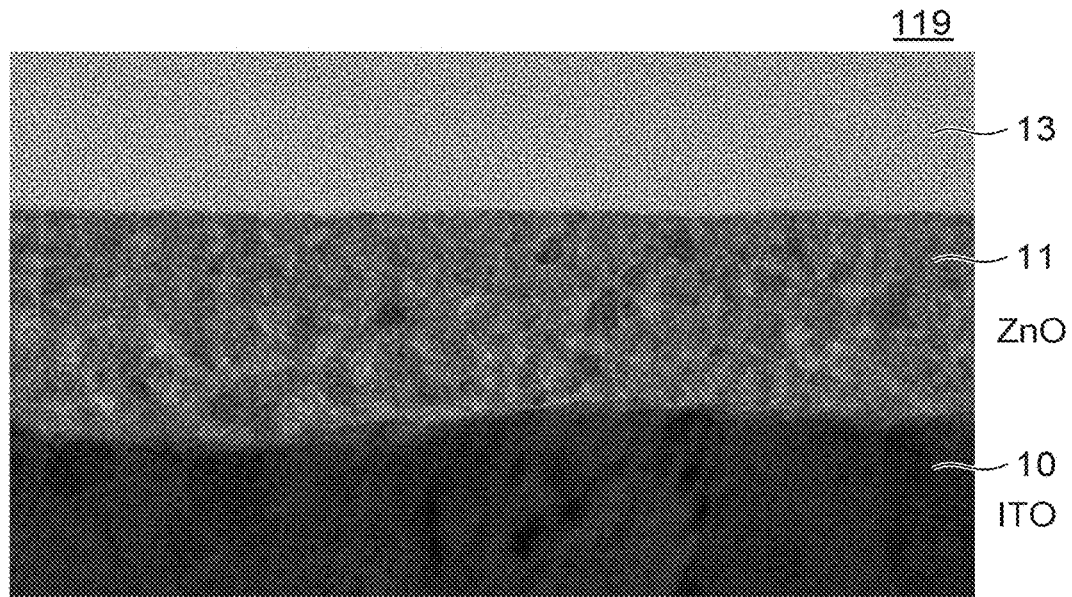
FIG. 14 (x1000k)   20nm
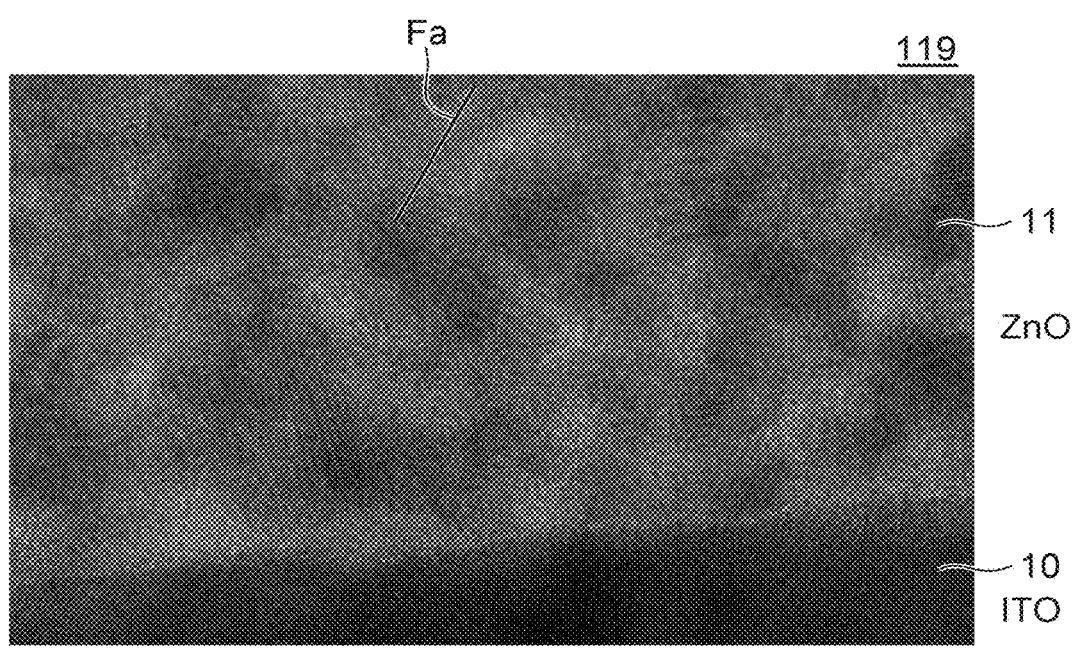
FIG. 15 (x3500k)   10nm

PHOTOELECTRIC CONVERSION ELEMENT AND METHOD FOR MANUFACTURING THE SAME

CROSS-REFERENCE TO RELATED APPLICATIONS

This application is based upon and claims the benefit of priority from Japanese Patent Application No. 2015-061830, filed on Mar. 25, 2015; the entire contents of which are incorporated herein by reference.

FIELD

An embodiment of the invention generally relates to a photoelectric conversion element and a method for manufacturing the same.

BACKGROUND

Research has been made on photoelectric conversion elements such as solar cells and sensors using organic photoelectric conversion materials or photoelectric conversion materials including organic matter and inorganic matter. Devices may be manufactured at relatively low cost when photoelectric conversion elements are produced by printing or coating photoelectric conversion materials. It is desirable to improve conversion efficiency for such photoelectric conversion elements.

BRIEF DESCRIPTION OF THE DRAWINGS

FIG. 14 is a transmission electron microscope image showing a cross section of a photoelectric conversion element;

FIG. 15 is a transmission electron microscope image showing a cross section of a photoelectric conversion element;

DETAILED DESCRIPTION

Figure 1A:
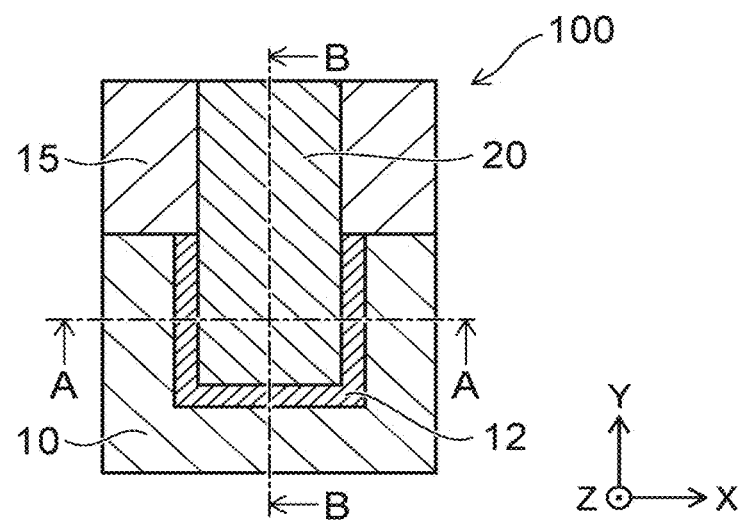
FIG. 1A to FIG. 1C are schematic views showing a photoelectric conversion element according to an embodiment.

According to one embodiment, a photoelectric conversion element includes a first electrode, a second electrode, a photoelectric conversion layer and a first layer. The photoelectric conversion layer is provided between the first electrode and the second electrode. The first layer is provided between the first electrode and the photoelectric conversion layer. The first layer includes at least a first metal oxide. The first layer has a plurality of orientation planes. At least one of the orientation planes satisfies the relationship L1>L2, where L1 is a length of the one of the plurality of orientation planes along a direction crossing a first direction, and L2 is a thickness of the first layer along the first direction. The first direction is from the first electrode toward the second electrode.

According to one embodiment, a method for manufacturing a photoelectric conversion element is disclosed. The element includes a first electrode, a second electrode, a photoelectric conversion layer, and a first layer. The photoelectric conversion layer is provided between the first electrode and the second electrode. The first layer is provided between the first electrode and the photoelectric conversion layer and includes at least a first metal oxide. The first layer has a plurality of orientation planes. At least one of the orientation planes satisfies the relationship L1>L2, where L1 is a length of the one of the plurality of orientation planes along a direction crossing a first direction, and L2 is a thickness of the first layer along the first direction. The first direction is from the first electrode toward the second electrode. The method includes forming a first electrode film serving as the first electrode. The method includes forming a film of a precursor solution by coating the precursor solution onto a first electrode film. The film of the precursor solution serves as the first layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

Figure 1B:
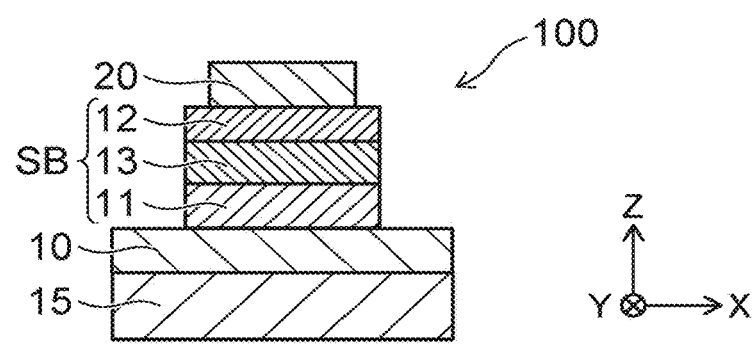
Figure 1C:
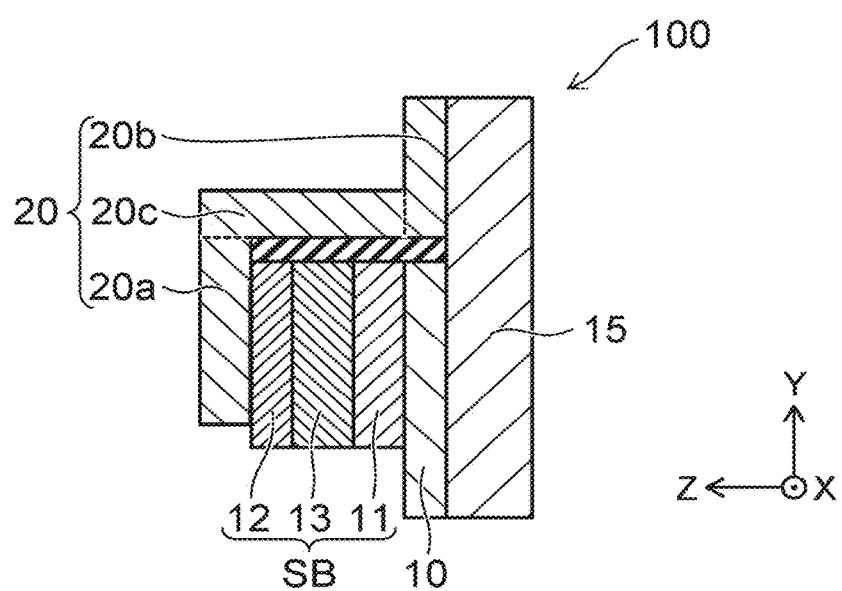

FIG. 1A to FIG. 1C are schematic views showing a photoelectric conversion element according to an embodiment. FIG. 1A is a schematic plan view showing the photoelectric conversion element 100 according to the embodiment. FIG. 1B is a schematic cross-sectional view of the photoelectric conversion element 100 along cross-section A-A shown in FIG. 1A. FIG. 1C is a schematic cross-sectional view of the photoelectric conversion element 100 along cross-section B-B shown in FIG. 1A.

As shown in FIG. 1A to FIG. 1C, the photoelectric conversion element 100 includes a first electrode 10, a second electrode 20, a first layer 11, a second layer 12, and a photoelectric conversion layer 13. The photoelectric conversion element 100 further includes a substrate 15. The photoelectric conversion element 100 is, for example, a solar cell or a sensor.

In this specification, a stacking direction from the first electrode 10 toward the photoelectric conversion layer 13 is taken as a Z-axis direction (a first direction). One direction perpendicular to the Z-axis direction is taken as an X-axis direction. A direction perpendicular to the X-axis direction and perpendicular to the Z-axis direction is taken as a Y-axis direction.

The first electrode 10 is provided on a portion of the substrate 15. The first electrode 10 is, for example, one selected from a positive electrode and a negative electrode.

The second electrode 20 is provided on the substrate 15 and is separated from the first electrode 10.

As shown in FIG. 1C, the second electrode 20 includes a first portion 20a, a second portion 20b, and a third portion 20c. The first portion 20a is provided on the first electrode 10 and is separated from the first electrode 10 in the Z-axis direction. The second portion 20b is arranged with the first electrode 10 in the Y-axis direction. The third portion 20c is provided between the first portion 20a and the second portion 20b and is continuous with the first portion 20a and the second portion 20b. The second electrode 20 is, for example, the other of the positive electrode or the negative electrode.

The photoelectric conversion layer 13 is provided between the first electrode 10 and the second electrode 20 (the first portion 20a). The photoelectric conversion layer 13 includes at least one selected from a material of an organic semiconductor and a material having a perovskite structure. For example, the photoelectric conversion layer 13 is formed by coating.

The first layer 11 is provided between the first electrode 10 and the photoelectric conversion layer 13. The first layer 11 is a first buffer layer.

The second layer 12 is provided between the second electrode 20 (the first portion 20a) and the photoelectric conversion layer 13. The second layer 12 is a second buffer layer.

For example, light is incident on the photoelectric conversion layer 13 via the substrate 15, the first electrode 10, and the first layer 11. Or, the light is incident on the photoelectric conversion layer 13 via the second electrode 20 and the second layer 12. At this time, electrons or holes are obtained by the light that is incident on the photoelectric conversion layer 13.

For example, the first layer 11 is an electron transport layer. The electrons that are generated are extracted from the first electrode 10 via the first layer 11. For example, the second layer 12 is a hole transport layer. The holes that are generated are extracted from the second electrode 20 via the second layer 12. Thus, electricity corresponding to the light incident on the photoelectric conversion element 100 is extracted via the first electrode 10 and the second electrode 20.

Members included in the photoelectric conversion element according to the embodiment will now be described in detail.

Substrate 15

The substrate 15 supports the other components (the first electrode 10, the second electrode 20, the first layer 11, the second layer 12, and the photoelectric conversion layer 13). An electrode may be formed on the substrate 15. It is favorable for the substrate 15 not to be altered by heat or organic solvents. The substrate 15 is, for example, a substrate including an inorganic material, a plastic substrate, a polymer film, a metal substrate, etc. Alkali-free glass, quartz glass, etc., may be used as the inorganic material. Polyethylene, polyethylene terephthalate (PET), polyethylene naphthalate (PEN), polyimide, polyamide, polyamide-imide, a liquid crystal polymer, a cycloolefin polymer, etc., may be used as the materials of the plastic and the polymer film. Stainless steel (SUS), titanium, silicon, etc., may be used as the material of the metal substrate.

In the case where the substrate 15 is disposed on the side of the photoelectric conversion element 100 where the light is incident, the substrate 15 includes a material (e.g., a transparent) material having a high light transmittance. An opaque substrate may be used as the substrate 15 in the case where the electrode (in the example, the second electrode 20) on the side opposite to the substrate 15 is transparent or semi-transparent. The thickness of the substrate 15 is not particularly limited as long as the substrate 15 has sufficient strength to support the other components.

In the case where the substrate 15 is disposed on the side of the photoelectric conversion element 100 where the light is incident, for example, an anti-reflection film having a moth-eye structure is mounted on the light incident surface. Thereby, the light is received efficiently; and it is possible to increase the energy conversion efficiency of the cell. The moth-eye structure is a structure including a regular protrusion array of about 100 nanometers (nm) in the surface. Due to the protrusion structure, the refractive index changes continuously in the thickness direction. Therefore, by interposing the anti-reflection film, a discontinuous change of the refractive index can be reduced. Thereby, the reflections of the light decrease; and the cell efficiency increases.

First Electrode 10 and Second Electrode 20

In the description relating to the first electrode 10 and the second electrode 20, simply the "the electrode" refers to at least one selected from the first electrode 10 and the second electrode 20.

The material of the first electrode 10 and the material of the second electrode 20 are not particularly limited as long as the materials are conductive. A conductive material that is transparent or semi-transparent is used as the material of the electrode (e.g., the first electrode 10) on the side transmitting the light. The first electrode 10 and the second electrode 20 are formed by vacuum vapor deposition, sputtering, ion plating, plating, coating, etc. A conductive metal oxide film, a semi-transparent metal thin film, etc., may be used as the electrode material that is transparent or semi-transparent.

Specifically, conductive glass, gold, platinum, silver, copper, or the like is used as the electrode material that is transparent or semi-transparent. Indium oxide, zinc oxide, tin oxide, a complex of these substances such as indium-tin-oxide (ITO), fluorine-doped tin oxide (FTO), or indium-zinc-oxide, an organic material including polyethylene dioxythiophene, etc., may be used as the material of the conductive glass. It is particularly favorable for ITO or FTO to be used as the material of the conductive glass. An organic conductive polymer such as polyaniline, a derivative of polyaniline, polythiophene, a derivative of polythiophene, etc., may be used as the electrode material.

In the case where the material of the electrode is ITO, it is favorable for the thickness of the electrode to be not less than 30 nm and not more than 330 nm. In the case where the thickness of the electrode is thinner than 30 nm, the conductivity decreases; and the resistance becomes high. A high resistance may cause the conversion efficiency to decrease. In the case where the thickness of the electrode is thicker than 330 nm, the flexibility of the ITO becomes low. Therefore, there are cases where the ITO breaks when stress is applied.

It is favorable for the sheet resistance to be as low as possible; and it is favorable to be not more than 10Ω/□. The electrode may be a single layer or may have a structure in which layers including materials having different work functions are stacked.

In the case where the electrode extracts electrons, it is favorable for a material having a low work function to be used as the material of the electrode. For example, an alkaline metal, an alkaline earth metal, etc., may be used as the material having the low work function. Specifically Li, In, Al, Ca, Mg, Sm, Tb, Yb, Zr, Na, K, Rb, Cs, Ba, or an alloy of these elements may be used. The electrode may be a single layer or may have a structure in which layers including materials having different work functions are stacked.

An alloy of at least one selected from the materials having low work functions described above and at least one selected from gold, silver, platinum, copper, manganese, titanium, cobalt, nickel, tungsten, and tin may be used. Examples of the alloy include a lithium-aluminum alloy, a lithium-magnesium alloy, a lithium-indium alloy, a magnesium-silver alloy, a calcium-indium alloy, a magnesium-aluminum alloy, an indium-silver alloy, a calcium-aluminum alloy, etc.

In the case where the electrode extracts electrons, it is favorable for the thickness of the electrode to be not less than 1 nm and not more than 500 nm. It is more favorable for the thickness of the electrode to be not less than 10 nm and not more than 330 nm. In the case where the thickness of the electrode is thinner than 1 nm, the resistance becomes too high; and there are cases where the charge that is generated cannot be conducted sufficiently to the external circuit. In the case where the thickness of the electrode is thicker than 500 nm, a long period of time is necessary to form the electrode. Therefore, the material temperature increases; and the performance may degrade due to damage to the other materials. Because a large amount of material is used, the time occupied by the apparatus (the film formation apparatus) that forms the electrode lengthens, which may increase the cost.

To promote the crystal growth of the metal oxide, it is desirable for the different types of buffer layers or the electrode used to form the foundation to be crystalline. It is favorable for the ITO, the FTO, etc., to be crystalline.

In the case where the electrode contacts the hole transport layer, it is favorable for a material having a high work function to be used as the material of the electrode. For example, Au, Ag, Cu, or an alloy of these elements may be used as the material having the high work function. The electrode may be a single layer or may have a structure in which layers including materials having different work functions are stacked.

In the case where the electrode contacts the hole transport layer, it is favorable for the thickness of the electrode to be not less than 1 nm and not more than 500 nm. It is more favorable for the thickness of the electrode to be not less than 10 nm and not more than 300 nm. In the case where the thickness of the electrode is thinner than 1 nm, the resistance becomes too high; and there are cases where the charge that is generated cannot be conducted sufficiently to the external circuit. In the case where the thickness of the electrode is thicker than 500 nm, a long period of time is necessary to form the electrode. Therefore, the material temperature increases; and the performance may degrade due to damage to the other materials. Because a large amount of material is used, the time occupied by the apparatus (the film formation apparatus) that forms the electrode lengthens, which may increase the cost.

Photoelectric Conversion Layer

The photoelectric conversion layer 13 may include a heterojunction or a bulk heterojunction made of an organic semiconductor. The photoelectric conversion layer 13 that includes the bulk heterojunction has a microlayer-separated structure in which a p-type semiconductor (an electron donor) and an n-type semiconductor (an electron acceptor) are mixed inside the photoelectric conversion layer 13. The p-type semiconductor and the n-type semiconductor that are mixed form a nano-order sized p-n junction inside the photoelectric conversion layer 13. A current is obtained by utilizing the photocharge separation occurring at the junction surface. The p-type semiconductor includes a material having electron-donating properties. On the other hand, the n-type semiconductor includes a material having electron-accepting properties. In the embodiment, at least one selected from the p-type semiconductor and the n-type semiconductor may be an organic semiconductor.

As the p-type organic semiconductor, for example, polythiophene, a derivative of polythiophene, polypyrrole, a derivative of polypyrrole, a pyrazoline derivative, an arylamine derivative, a stilbene derivative, a triphenyldiamine derivative, oligothiophene, a derivative of oligothiophene, polyvinyl carbazole, a derivative of polyvinyl carbazole, polysilane, a derivative of polysilane, a polysiloxane derivative having aromatic amine at a side chain or a main chain, polyaniline, a derivative of polyaniline, a phthalocyanine derivative, porphyrin, a derivative of porphyrin, polyphenylene vinylene, a derivative of polyphenylene vinylene, polythienylene vinylene, a derivative of polythienylene vinylene, a benzodithiophene derivative, a thieno[3,2-b]thiophene derivative, etc., may be used. These substances may be used in combination as the p-type organic semiconductor. Also, a copolymer of these substances may be used. For example, a thiophene-fluorene copolymer, a phenylene ethynylene-phenylene vinylene copolymer, etc., may be used as the copolymer.

It is favorable to use polythiophene, which is a pi-conjugated conductive polymer, or a derivative of polythiophene as the p-type organic semiconductor. Relatively superior stereoregularity can be ensured for polythiophene and derivatives of polythiophene. The solubility of polythiophene and derivatives of polythiophene in solvents is relatively high. The polythiophene and the derivatives of polythiophene are not particularly limited as long as a compound having a thiophene skeleton is used. Specific examples of polythiophene and derivatives of polythiophene are polyalkylthiophene, polyarylthiophene, polyalkyl isothionaphthene, polyethylene dioxythiophene, etc. Poly(3-methylthiophene), poly(3-butylthiophene), poly(3-hexylthiophene), poly(3-octylthiophene), poly(3-decylthiophene), poly(3-dodecylthiophene), etc., may be used as the polyalkylthiophene. Poly(3-phenylthiophene), poly(3-(p-alkylphenylthiophene)), etc., may be used as the polyarylthiophene. Poly(3-butyl isothionaphthene), poly(3-hexyl isothionaphthene), poly(3-octyl isothionaphthene), poly(3-decyl isothionaphthene), etc., may be used as the polyalkyl isothionaphthene.

In recent years, derivatives of PCDTBT (poly[N-9"-hepta-decanyl-2,7-carbazole-alt-5,5-(4',7'-di-2-thienyl-2',1', 3'-benzothiadiazole)]) or the like which are copolymers including carbazole, benzothiadiazole, and thiophene are known as compounds for which excellent conversion efficiency is obtained. A copolymer of a benzodithiophene (BDT) derivative and a thieno[3,2-b]thiophene derivative also is favorable. For example, poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), PTB7-Th (having the alternative names of PCE10 and PBDTTT-EFT) to which a thienyl group having electron-donating properties weaker than those of the alkoxy group of PTB7 is introduced, or the like is favorable.

A film or a layer can be formed by coating solutions of these conductive polymers dissolved in solvents. Accordingly, an organic thin film solar cell that has a large surface area can be manufactured inexpensively using inexpensive equipment by printing, etc.

Although it is favorable to use fullerene or a derivative of fullerene as the n-type organic semiconductor, the n-type organic semiconductor is not particularly limited. Specifically, a derivative configured to have a basic skeleton of $C_{60}$, $C_{70}$, $C_{76}$, $C_{78}$, $C_{84}$, etc., may be used. The carbon atoms of the fullerene skeleton of the fullerene derivative may be modified with any functional group; and a ring may be formed of functional groups bonded to each other. Fullerene derivatives also include fullerene-binding polymers. It is favorable for the fullerene derivative to include a functional group having high affinity with the solvent and to have high solubility in the solvent.

As the functional group of the fullerene derivative, for example, a hydrogen atom, a hydroxide group, a halogen atom such as a fluorine atom, a chlorine atom, etc., an alkyl group such as a methyl group, an ethyl group, etc., an alkenyl group such as a vinyl group, etc., a cyano group, an alkoxy group such as a methoxy group, an ethoxy group, etc., an aromatic hydrocarbon group such as a phenyl group, a naphthyl group, etc., an aromatic heterocyclic group such as a thienyl group, a pyridyl group, etc., may be used. Specifically, hydrogenated fullerene such as $C_{60}H_{36}$, $C_{70}H_{36}$, etc., oxide fullerene such as $C_{60}$, $C_{70}$, etc., a fullerene metal complex, etc., may be used.

Among those described above, it is particularly favorable to use [60]PCBM ([6,6]-phenyl $C_{61}$ butyric acid methyl ester) or [70]PCBM ([6,6]-phenyl $C_{71}$ butyric acid methyl ester) as the fullerene derivative.

In the case where unmodified fullerene is used, it is favorable to use $C_{70}$. The generation efficiency of the photo carriers of fullerene $C_{70}$ is high; and fullerene $C_{70}$ is suited to use in the organic thin film solar cell.

In the photoelectric conversion layer 13, it is favorable for the mixing ratio of the p-type organic semiconductor and the n-type organic semiconductor to be a weight ratio such that the weight of the n-type organic semiconductor is 0.5 to 4.0 for a weight of the p-type organic semiconductor of 1. In the case where the p-type semiconductor is the P3AT-type, it is favorable to set n-type organic senniconductor:p-type organic semiconductor=1:1. In the case where the p-type semiconductor is the PCDTDT-type, it is favorable to set the mixing ratio of the n-type organic semiconductor and the p-type organic semiconductor to be about n-type organic senniconductor:p-type organic semiconductor=4:1. In the case where the p-type semiconductor is the PCE-10-type, it is favorable to set the mixing ratio of the n-type organic semiconductor and the p-type organic semiconductor to be about n-type organic semiconductor:p-type organic semiconductor=1:1 to 3:1, and particularly favorable to be 1.5:1.

The photoelectric conversion layer 13 may include a material having a perovskite structure. The perovskite structure is made of an ion A, an ion B, and an ion X and can be expressed as $ABX_3$. The structure may be a perovskite structure when the ion B is small compared to the ion A. The perovskite structure has a cubic unit lattice. The ion A is disposed at each corner of the cubic crystal; the ion B is disposed at the body center; and the ion X is disposed at each face center of the cubic crystal centered around the ion B.

The orientation of the $BX_6$ octahedron distorts easily due to interactions with the ions A. Due to the decrease of the symmetry, a Mott transition occurs; and valence electrons localizing at the ions M can spread as a band. It is favorable for the ion A to be $CH_3NH_3$. It is favorable for the ion B to be at least one selected from Pb and Sn. It is favorable for the ion X to be at least selected from Cl, Br, and I. Each of the materials of the ion A, the ion B, and the ion X may be a single material or a mixed material.

When coating the photoelectric conversion layer, a material is dissolved in a solvent. For example, an unsaturated hydrocarbon solvent, a halogenated aromatic hydrocarbon solvent, a halgenated saturated hydrocarbon solvent, an ether, etc., may be used as the solvent used when coating. Toluene, xylene, tetralin, decalin, mesitylene, n-butylbenzene, sec-butylbenzene, tert-butylbenzene, etc., may be used as the unsaturated hydrocarbon solvent. Chlorobenzene, dichlorobenzene, trichlorobenzene, etc., may be used as the halogenated aromatic hydrocarbon solvent. Carbon tetrachloride, chloroform, dichloromethane, dichloroethane, chlorobutane, bromobutane, chloropentane, chlorohexane, bromohexane, chlorocyclohexane, etc., may be used as the halgenated saturated hydrocarbon solvent. Tetrahydrofuran, tetrahydropyran, etc., may be used as the ether. It is more favorable to use a halogen aromatic solvent. DMF (N,N-dimethylformamide), 2-propanol, or γ-butyrolactone also may be used. It is possible to use these solvents independently or mixed. The solvent is not particularly constrained as long as the solvent can dissolve the material.

Spin coating, dip coating, casting, bar coating, roll coating, wire-bar coating, spraying, screen printing, gravure printing, flexographic printing, offset printing, gravure-offset printing, dispenser coating, nozzle coating, capillary coating, inkjet, etc., may be used as the method for forming the film or the layer by coating the solution. These coating methods may be used independently or in combination.

First Layer 11 and Second Layer 12

The first layer 11 and the second layer 12 are positioned respectively between the photoelectric conversion layer 13 and the electrodes. One of the first layer 11 or the second layer 12 is a hole transport layer or an electron transport layer. At least one selected from the first layer 11 and the second layer 12 includes a metal oxide. Titanium oxide, molybdenum oxide, vanadium oxide, zinc oxide, nickel oxide, lithium oxide, calcium oxide, cesium oxide, and aluminum oxide are favorable examples of the metal oxide. Two or more types of metals may be used.

In the case where the first layer 11 (the first buffer layer) is the electron transport layer, zinc oxide is more favorable as the material (a first metal oxide) of the first layer 11. Zinc oxide has a partial structure expressed by at least one selected from the following first partial structure of Formula (1), a second partial structure of Formula (2), and a third partial structure of Formula (3).

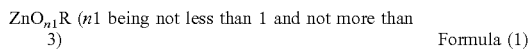

$$ZnO_{n1}R \text{ ($n1$ being not less than 1 and not more than 3)} \quad \text{Formula (1)}$$

$$ZnO(H_2O)R \quad \text{Formula (2)}$$

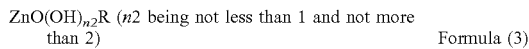

$$ZnO(OH)_{n2}R \text{ ($n2$ being not less than 1 and not more than 2)} \quad \text{Formula (3)}$$

It is more favorable for R to be —$C_2H_5$, —$CH_3$, —CO—$C_2H_5$, or —CO—$CH_3$.

In the case where the second layer 12 (the second buffer layer) is the hole transport layer, vanadium oxide is more favorable as the material (a second metal oxide) of the second layer 12. It is favorable for the thickness of the second layer 12 to be 10 nm or more. In the case where the photoelectric conversion element is used for a long period of time, the back surface electrode (e.g., the second electrode 20) may migrate to the photoelectric conversion layer. For durability, it is favorable for the thickness of the second layer 12 to be not less than a constant. It is favorable to form the vanadium oxide as a film using vanadium pentoxide as a source material.

Figure 2:
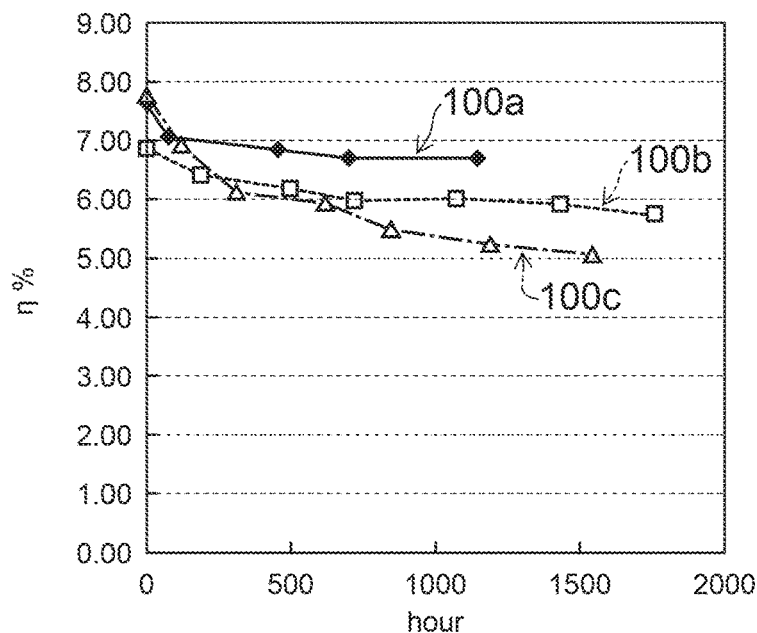
FIG. 2 is a graph showing characteristics of photoelectric conversion elements according to the embodiment.

FIG. 2 is a graph showing characteristics of photoelectric conversion elements according to the embodiment.

FIG. 2 shows characteristics of the photoelectric conversion elements 100a, 100b, and 100c according to the embodiment. The thickness of the first layer 11 is 2 nm in the photoelectric conversion elements 100a, 100b, and 100c. The thickness of the second layer 12 (the vanadium oxide) of the photoelectric conversion element 100a is 10 nm. The thickness of the second layer 12 of the photoelectric conversion element 100b is 20 nm. The thickness of the second layer 12 of the photoelectric conversion element 100c is 1 nm. Otherwise, a description similar to the description of the photoelectric conversion element 100 is applicable to the configurations of the photoelectric conversion elements 100a, 100b, and 100c.

FIG. 2 shows the results of an endurance test of the photoelectric conversion elements. In the endurance test, the temperature of the photoelectric conversion element is maintained at a high temperature; and the temporal change of a conversion efficiency η is measured. The endurance test is implemented according to MS C 8938 B-1-1995.

As shown in FIG. 2, as the thickness of the second layer 12 increases, the conversion efficiency η decreases less easily; and the durability is high. For example, for the photoelectric conversion element 100c in which the thickness of the second layer 12 is 1 nm, the conversion efficiency η decreases greatly as time elapses. On the other hand, for the photoelectric conversion element 100a or 100b, the decrease of the conversion efficiency η from the initial conversion efficiency η is less than 10%. For the photoelectric conversion element 100c, the slope increases at some point past 500 hours. At this point in time, it is considered that migration occurred from the back surface electrode to the active layer (the photoelectric conversion layer) and caused the conversion efficiency to decrease. In the embodiment, the high conversion efficiency can be maintained by setting the thickness of the second layer 12 to be, for example, 10 nm or more.

On the other hand, in the case where the second layer 12 is too thick, the number of photons received by the photoelectric conversion layer 13 undesirably decreases due to the effect of the optical interference. This is apparent from the graph shown in FIG. 3 as well.

Figure 3:
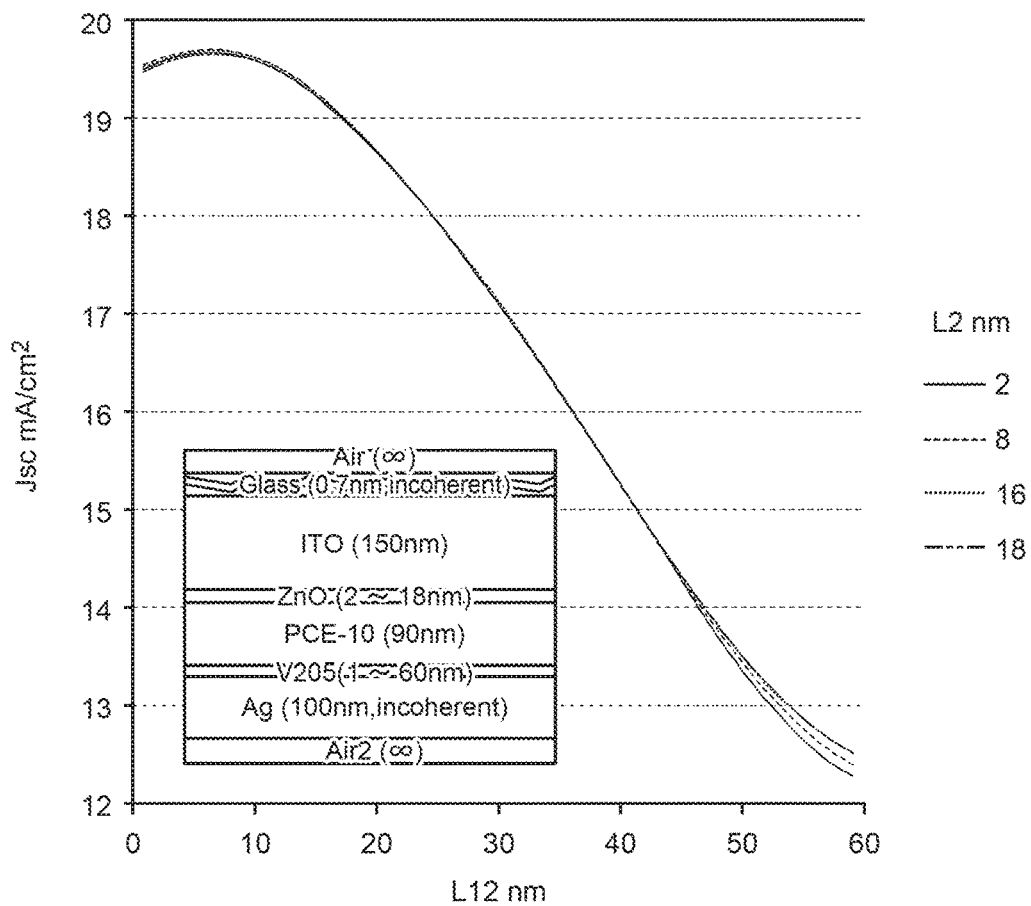
FIG. 3 is a graph showing an optical simulation result of photoelectric conversion elements.

FIG. 3 shows characteristics of the photoelectric conversion element obtained by optical simulation using SETFOS (Cybernet Systems Co., Ltd.). FIG. 3 shows the relationship between a short circuit current density Jsc and a thickness L12 of the second layer 12 (the vanadium oxide). In the simulation, a thickness L2 of the first layer 11 is set to 2 nm, 8 nm, 16 nm, and 18 nm. In the case where the second layer 12 is too thick, the conversion efficiency decreases because the photocurrent that is extracted decreases. It is favorable for the thickness of the second layer 12 to be 40 nm or less. It is favorable for the refractive index of the second layer 12 to be not less than 1.8 and not more than 4. It is more favorable to be not less than 1.85 and not more than 2.1.

For example, amorphous titanium oxide obtained by hydrolysis of titanium alkoxide by a sol-gel method may be used as the metal oxide included in the first layer 11 or the second layer 12. Although the method for forming the second layer 12 is not particularly limited as long as the method can form a thin film, for example, spin coating may be used. In the case where titanium oxide is used as the material of the electron transport layer, it is desirable to form a film having a thickness of 5 to 20 nm. In the case where the thickness of the film is thinner than the range recited above, the hole blocking effect decreases. Therefore, the excitons that are generated deactivate before dissociating into electrons and holes. Therefore, a current cannot be extracted efficiently. The resistance of the film becomes large in the case where the thickness of the film is too thick. Thereby, the conversion efficiency decreases because the generated current is limited. It is desirable for the solution that is coated to be pre-filtered using a filter. After the solution is coated to have a specified thickness, heating and drying are performed using a hotplate, etc. The heating and the drying are performed while promoting hydrolysis in air at not less than 50° C. and not more than 100° C. for several minutes to about 10 minutes.

An example of a method for manufacturing the photoelectric conversion element according to the embodiment will now be described.

In the example, the substrate 15 includes a glass substrate. ITO is used as the material of the first electrode 10. Zinc oxide (ZnO) is used as the material of the first layer 11 used to form the electron transport layer. Vanadium oxide is used as the material of the second layer 12 used to form the hole transport layer. PCE-10 (poly[4,8-bis(5-(2-ethylhexyl)thiophen-2-yl) benzo[1,2-b;4,5-b']dithiophene-2,6-diyl-alt-(4-(2-ethylhexyl)-3-fluorothieno[3,4-b]thiophene-)-2-carboxylate-2-6-diyl)] made by 1-Material Inc.) is used as the p-type organic semiconductor material of the photoelectric conversion layer 13. [70]PCBM is used as the n-type organic semiconductor material of the photoelectric conversion layer 13. The n-type organic semiconductor material and the p-type organic semiconductor material form a bulk heterojunction inside the photoelectric conversion layer 13.

First, ITO is formed on the glass substrate 15 by sputtering. Thereby, a first electrode film (an ITO film) to serve as the first electrode 10 is formed.

Subsequently, a zinc oxide precursor solution is coated onto the first electrode film using spin coating. Thereby, a solution film to serve as the first layer 11 is formed. Here, the zinc oxide precursor solution that is used is a solution in which a second solution of THF (tetrahydrofuran) mixed with water is added to a first solution of diethylzinc mixed with 1,2-diethoxyethane in a nitrogen atmosphere. In the first solution, the ratio of the volume of diethylzinc and the volume of 1,2-diethoxyethane is 1:9. In the second solution, the ratio of THF and water is 1:1. In the zinc oxide precursor solution, the ratio (the mole ratio) of the substance amount of zinc and the substance amount of water is 1:0.6. The zinc oxide precursor solution is diluted so that the weight percent concentration of zinc is not less than 0.5% but less than 10%. It is favorable for the coating by spin coating to be implemented in a nitrogen atmosphere. In the case where the concentration is high, there is a trend for the starting points of the crystal growth per unit surface area to increase and for the orientation planes to become small. It is favorable for the concentration of zinc of the zinc oxide precursor solution to be low. For example, it is favorable for the weight percent concentration of zinc of the zinc oxide precursor solution to be 2% or less. The coating is performed once without performing multiple separate coatings. This is because when the coating is performed multiply in parts, the outermost surface formed each coating becomes a grain boundary; and the performance may degrade. Subsequently, the solution film that is formed by coating is heated at not less than 100° C. and not more than 500° C. for 5 minutes and is dried. It is favorable to use not less than 100° C. and not more than 200° C. It is favorable for the atmosphere when drying to be ambient air. For example, it is favorable for the oxygen concentration to be not less than 19% and not more than 22%. It is favorable for the humidity to be not less than 10% and not more than 30%. The crystal growth is promoted by the oxygen concentration.

Subsequently, a third solution of PCE-10 and [70]PCBM is coated using spin coating. Thereby, a photoelectric conversion film that is used to form the photoelectric conversion layer 13 is formed. In the third solution, the weight ratio of PCE-10 and [70]PCBM is 1:2. The solution that is included in the third solution is CB (chlorobenzene) including DIO (diiodooctane). The weight percent of DIO in the solution is 3%.

Subsequently, $V_2O_5$ that is used to form the second layer 12 is heated and vapor-deposited using a vapor deposition apparatus. The thickness of the vanadium oxide is 2 nm. A Ag film is further vapor-deposited using the vapor deposition apparatus. The thickness of the Ag film is 100 nm. Thus, the photoelectric conversion element 100 according to the embodiment is manufactured.

Figure 4:
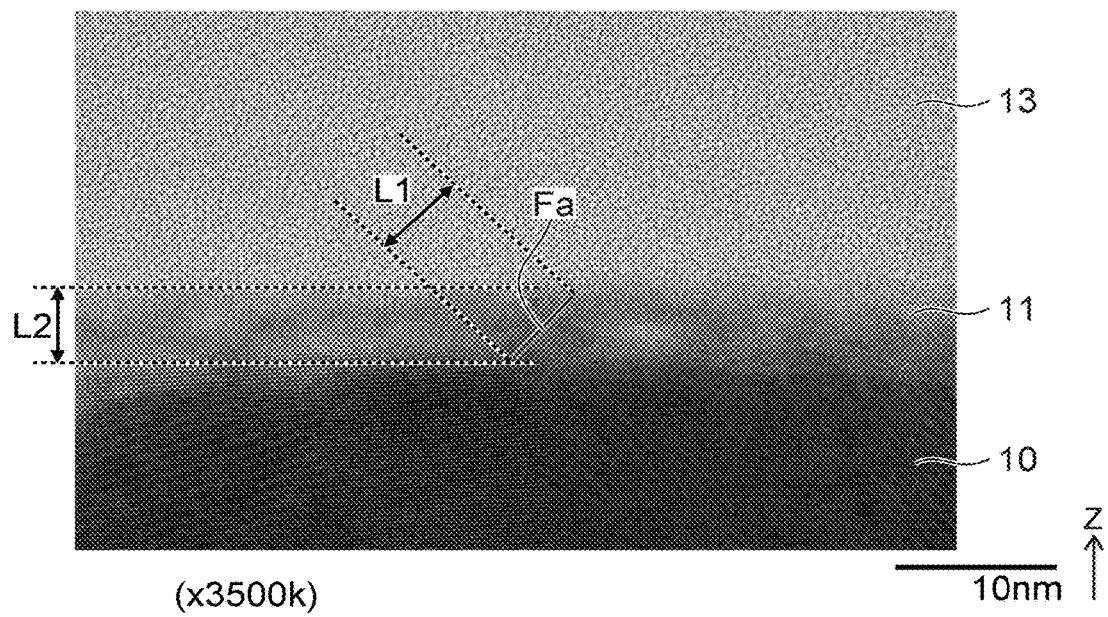
FIG. 4 is a transmission electron microscope photograph showing a cross section of the photoelectric conversion element according to the embodiment.
Figure 5:
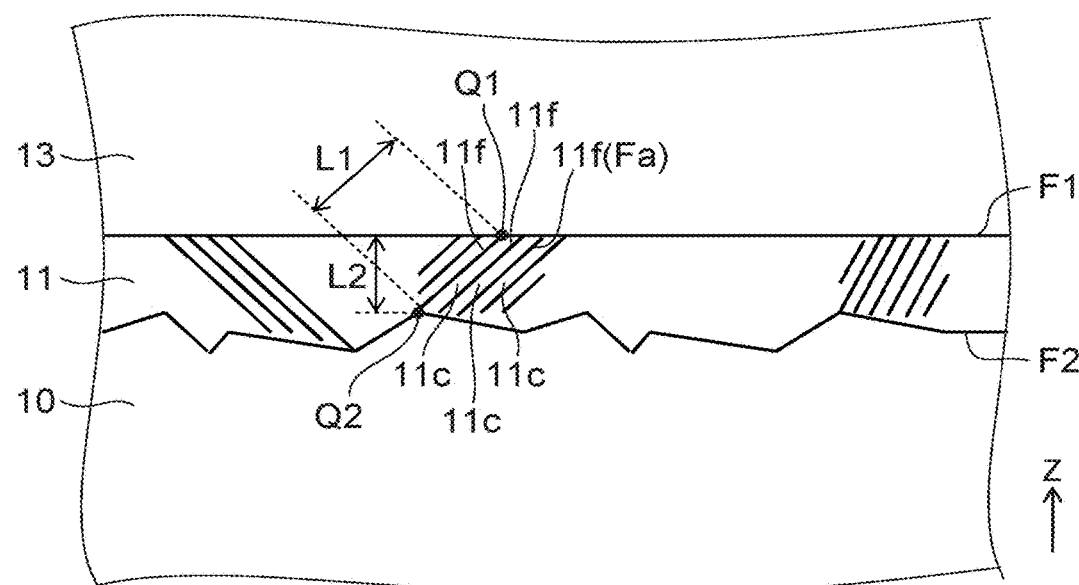
FIG. 5 is a schematic cross-sectional view showing the photoelectric conversion element according to the embodiment.

FIG. 4 is a transmission electron microscope photograph showing a cross section of the photoelectric conversion element according to the embodiment. FIG. 5 is a schematic cross-sectional view showing the photoelectric conversion element according to the embodiment. The evaluation section of the photoelectric conversion element was picked up and thinned to about 0.1 μm using FIB (a focused ion beam milling instrument such as XVision 200 TBS made by Hitachi High-Tech Science Corporation or Helios 450 made by FEI); and subsequently, TEM observation of the cross section was performed. To make the sample by FIB, a C film and a W film were formed as sample surface protection films. A TEM (transmission electron microscope H 9500 made by the Hitachi High-Technologies Corporation (acceleration voltage: 200 kV)) was used. The thickness of the thin section is not particularly limited as long as the observation of the orientation plane is easy (contrast of the image is obtained easily).

FIG. 4 is a TEM (Transmission Electron Microscope) image of a cross section parallel to the Z-axis direction of the photoelectric conversion element 100 manufactured by the manufacturing method described above. The first electrode 10 (the ITO), the first layer 11, and the photoelectric conversion layer 13 are shown in the TEM image. FIG. 5 schematically shows the photograph of FIG. 4.

Orientation planes Fa of the crystal inside the first layer 11 can be observed in FIG. 4 and FIG. 5. The orientation planes mean the collection of surfaces made of atoms of the unit lattice. As shown in FIG. 5, a portion of the first layer 11 includes multiple crystal regions 11c (crystal grains or crystallites). For example, the crystal regions 11c have layer configurations. For example, the orientation planes Fa of the multiple crystal regions 11c are tilted with respect to the Z-axis direction and are arranged periodically in a direction perpendicular to the tilt direction. Here, the Z-axis direction is the stacking direction (the first direction) from the first electrode 10 toward the second electrode 20.

A length L1 of at least one of the multiple orientation planes Fa of the crystal regions 11c is longer than the thickness L2 (the length along the Z-axis direction) of the first layer 11. In other words, at least one of the lengths L1 of boundaries 11f (the orientation planes Fa) between the multiple crystal regions 11c is longer than the thickness L2 of the first layer 11. Thereby, a layer having high carrier mobility and low light scattering is obtained; and it is possible to extract more photocurrent.

It can be seen from FIG. 4 that it is favorable for the first layer 11 not to include a void inside the layer. This is because the void promotes the light scattering and the carrier mobility.

The crystal regions 11c of the photoelectric conversion element of the embodiment are provided to be continuous from the first electrode 10 to the photoelectric conversion layer 13. One end of at least one of the boundaries 11f of the crystal regions 11c contacts a first adjacent layer (in this case, the first electrode 10) adjacent to the first layer 11; and one other end of the at least one of the boundaries 11f of the crystal regions 11c contacts a second adjacent layer (in this case, the photoelectric conversion layer 13) other than the first adjacent layer. The second adjacent layer is adjacent to the first layer 11.

For example, as shown in FIG. 5, the first layer 11 has a first surface F1, and a second surface F2 separated from the first surface F1 in the Z-axis direction. In such a case, the one end of the boundary 11f contacts the first surface F1; and the one other end of the boundary 11f contacts the second surface F2.

L2 may be different between the portions that are measured. Therefore, L2 is defined as follows in the embodiment. As shown in FIG. 5, one orientation plane is selected from the multiple orientation planes; Q1 is the point where the one orientation plane Fa contacts the photoelectric conversion layer 13 (or the first surface F1); Q2 is the point where the one orientation plane Fa contacts the first electrode (or the second surface F2); and the length L1 of the orientation plane Fa is the distance between the point Q1 and the point Q2. The thickness L2 of the first layer 11 is the distance between a straight line passing through the point Q1 perpendicular to the Z-axis direction and a straight line passing through the point Q2 perpendicular to the Z-axis direction. The embodiment includes at least one orientation plane Fa satisfying the relationship L1>L2, where L1 and L2 are defined as recited above.

In the case where the configuration of the first surface F1 or the second surface F2 of the first layer 11 changes in the thickness direction (the depth direction of the image) of the thin section, there are cases where the first surface F1 or the second surface F2 of the first layer 11 is unclear (there are cases where the boundary of the layer adjacent to the first layer 11 is unclear). In such a case, it may be difficult to discriminate whether or not the orientation plane contacts the adjacent layer (e.g., to discriminate the point Q1 or the point Q2). In such a case, it can be said that the orientation plane 11f (Fa) substantially contacts the adjacent surface if the width of the unclear region between the first layer and the layer adjacent to the first layer is not more than ⅕ of L1 of the orientation plane 11f (Fa).

The length L1 of the boundary 11f of the crystal region 11c is, for example, not less than 2 nm and not more than 54 nm, and more favorably not less than 2 nm and not more than 9 nm. In the example of FIG. 5, the length L1 is about 6 nm. The period at which the multiple crystal regions 11c are arranged is, for example, not less than 2 nm and not more than 500 nm. For example, the thickness and the period can be determined using a transmission electron microscope.

Thus, in the photoelectric conversion element 100 according to the embodiment, the orientation planes inside the first layer 11 grow to be long compared to the thickness of the first layer 11. The multiple crystal regions are formed in an orderly fashion.

In the case where the first layer 11 has the first surface F1 that contacts the photoelectric conversion layer 13 and the second surface F2 that contacts the first electrode, for example, the first surface F1 is flatter than the second surface F2. A maximum height Rz of the first surface F1 is not less than about 1 nm and not more than about 5 nm. The maximum height Rz of the second surface F2 is not less than about 10 nm and not more than about 150 nm. The "maximum height Rz" refers to the spacing between the hill peak and the dale bottom for a reference length.

Figure 6:
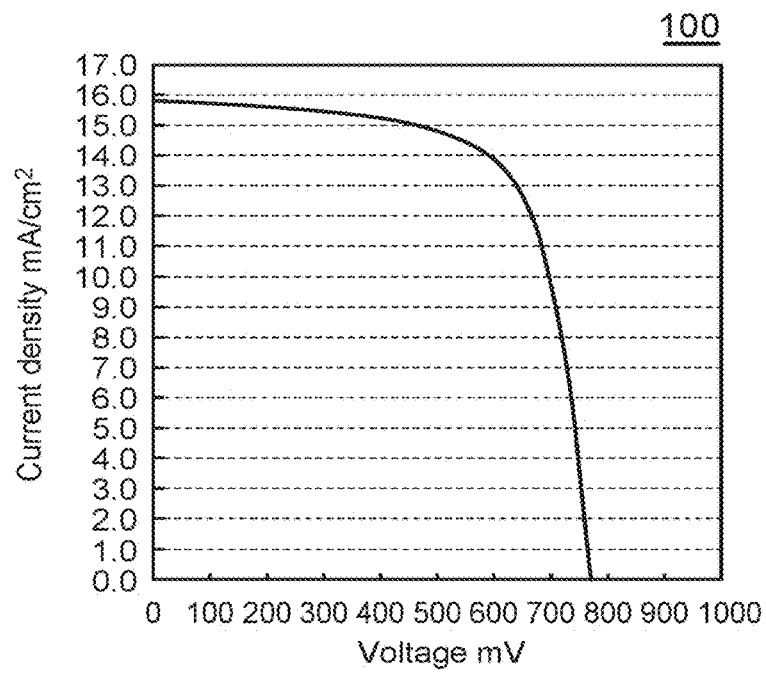
FIG. 6 is a graph showing a characteristic of the photoelectric conversion element according to the embodiment.

FIG. 6 is a graph showing a characteristic of the photoelectric conversion element according to the embodiment.

Figure 7:
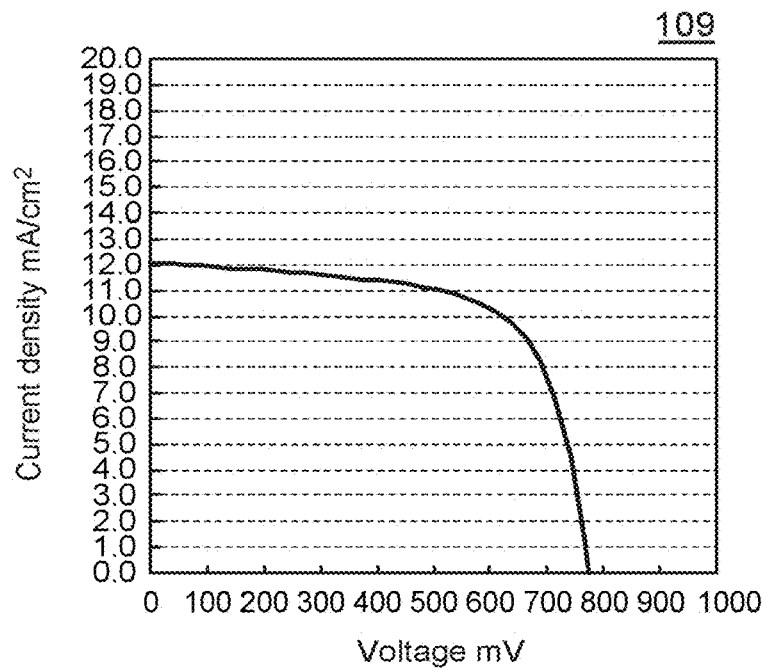
FIG. 7 is a graph showing a characteristic of a photoelectric conversion element according to a reference example.

FIG. 7 is a graph showing a characteristic of a photoelectric conversion element according to a reference example.

FIG. 6 shows the IV characteristic of the photoelectric conversion element 100 described in reference to FIG. 4. FIG. 7 shows the IV characteristic of the photoelectric conversion element 109 according to the reference example.

The formation of the first buffer layer (the first layer 11) of the photoelectric conversion element 109 according to the reference example differs from that of the photoelectric conversion element 100. In the formation of the photoelectric conversion element 109, a ZnO particle dispersion liquid (having an average particle size of 2 nm) is coated onto ITO (the first electrode) by spin coating. Thereby, the first buffer layer is formed; and subsequently, heating is performed at 80° C. in ambient air for 10 minutes. The thickness of the first buffer layer of the photoelectric conversion element 109 is 25 nm. Otherwise, the formation of the photoelectric conversion element 109 is similar to the formation of the photoelectric conversion element 100. In the first buffer layer that is formed from ZnO particles, the ZnO particles form grain boundaries; and a stacked body of the ZnO particles is formed. It is necessary to stack multiple particles in the Z-axis direction to form a film having no pinholes on the ITO. That is, in the first layer 11 that is formed, the orientation planes Fa are not continuous from the ITO to the photoelectric conversion layer 13.

To measure the IV characteristic, incident light is irradiated on the photoelectric conversion element; and Jsc (the short circuit current density) between the first electrode 10 and the second electrode 20 and Voc (the open circuit voltage) between the first electrode 10 and the second electrode 20 are measured. The conditions of the incident light are 100 mW/cm² for AM 1.5.

In the photoelectric conversion element 109 of the reference example as shown in FIG. 7, Jsc is about 12 mA/cm². The fill factor of the photoelectric conversion element 109 is 0.67; and the conversion efficiency is 6.23%.

Conversely, in the photoelectric conversion element 100 as shown in FIG. 6, Jsc is high and is about 15.8 mA/cm². The conversion efficiency of the photoelectric conversion element 100 is 8.4%. Thus, in the photoelectric conversion element 100 according to the embodiment, a high conversion efficiency is obtained compared to the photoelectric conversion element 109 of the reference example.

For example, when a carrier that is excited in the photoelectric conversion layer 13 is transported, the carrier is trapped in the intermediate level of the grain boundary inside the first buffer layer. Thereby, the mobility of the carrier decreases. For example, the mobility of the carrier decreases easily in the case where the grain boundaries are fine and the orientation is disorderly. Therefore, the conversion efficiency of the photoelectric conversion element may decrease.

Conversely, in the first buffer layer (the first layer 11) of the photoelectric conversion element 100, the orientation planes Fa of the crystal regions 11c of zinc oxide grow to be long compared to the thickness of the first layer 11. The crystal regions 11c are continuous from the first electrode 10 to the photoelectric conversion layer 13. The crystal regions 11c are formed in an orderly fashion. Therefore, it is considered that the carrier traps can be suppressed when the carrier is transported. The mobility of the carrier improves; and the conversion efficiency of the photoelectric conversion element can be increased.

Figure 8:
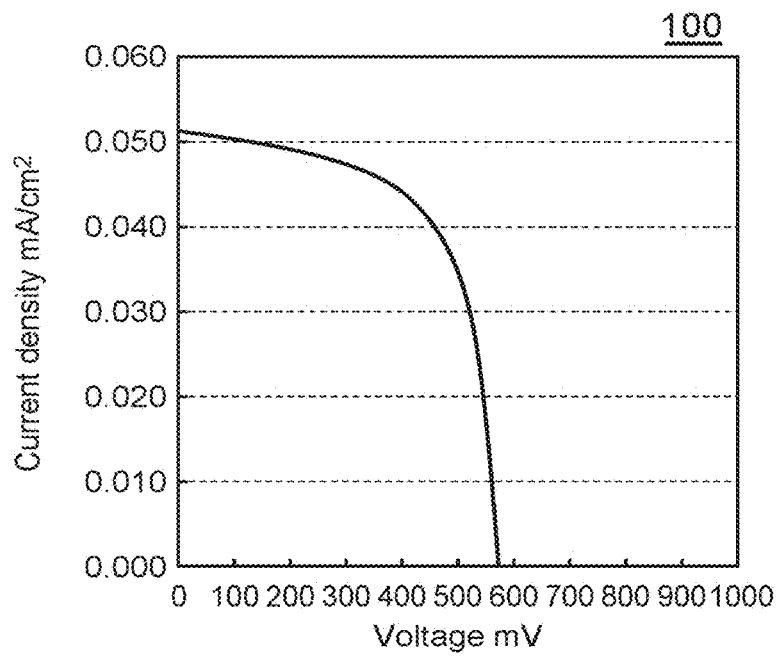
FIG. 8 is a graph showing a characteristic of the photoelectric conversion element according to the embodiment.

FIG. 8 is a graph showing a characteristic of the photoelectric conversion element according to the embodiment.

Figure 9:
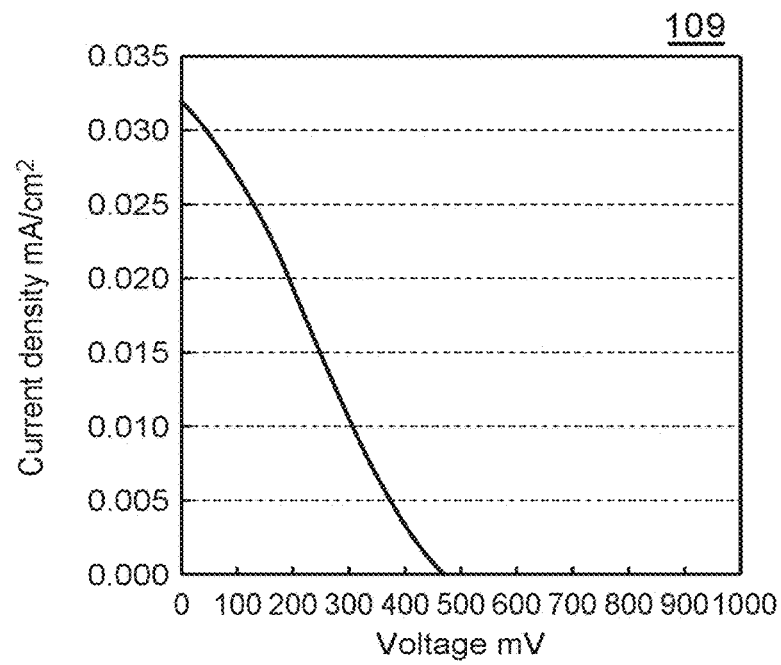
FIG. 9 is a graph showing a characteristic of the photoelectric conversion element according to the reference example.

FIG. 9 is a graph showing a characteristic of the photoelectric conversion element according to the reference example.

FIG. 8 shows the IV characteristic for low illuminance of the photoelectric conversion element 100 described in reference to FIG. 4. FIG. 9 shows the IV characteristic for low illuminance of the photoelectric conversion element 109 according to the reference example. For the IV characteristic for low illuminance, a lighting box (LLBG1-FA-20x30-TSK made by AITEC System Co., Ltd.) was used as the light source; and the illuminance was confirmed using MS-720 (made by EKO Instruments).

In the photoelectric conversion element 109 of the reference example as shown in FIG. 9, Jsc is about 32 μA/cm². The fill factor of the photoelectric conversion element 109 is 0.26; and the conversion efficiency is 2.4%.

Conversely, in the photoelectric conversion element 100 as shown in FIG. 8, Jsc is high and is about 50 μA/cm². The fill factor is 0.63; and the conversion efficiency of the photoelectric conversion element 100 is 12.2%. Thus, in the photoelectric conversion element 100 according to the embodiment, a high conversion efficiency is obtained compared to the photoelectric conversion element 109 of the reference example. The increase of the conversion efficiency according to the embodiment occurs markedly at low illuminance, and markedly affects the fill factor as shown in FIG. 8. It is considered that this is caused by the improvement of the carrier mobility described above.

Figure 10:
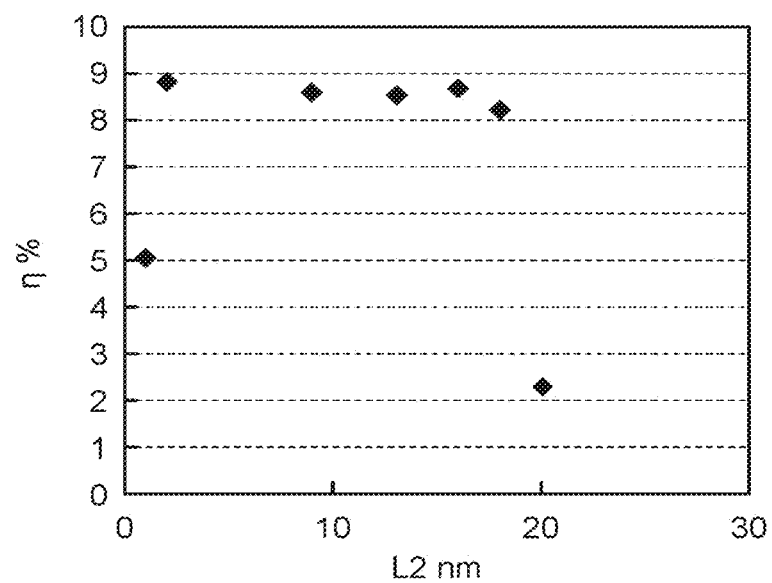
FIG. 10 is a graph showing a characteristic of the photoelectric conversion element according to the embodiment.

FIG. 10 is a graph showing a characteristic of the photoelectric conversion element according to the embodiment.

FIG. 10 shows the conversion efficiency η when the thickness L2 of the first layer 11 of the photoelectric conversion element 100 according to the embodiment is changed.

As shown in FIG. 10, a high conversion efficiency of 8% or more can be obtained in the range in which the thickness of the first layer 11 is not less than 2 nm and not more than 18 nm. For example, it is considered that the resistance of the first layer 11 becomes high and the conversion efficiency decreases in the case where the first layer 11 is thick compared to the crystal region 11c. In the embodiment, it is favorable for the thickness of the first layer 11 to be not less than 2 nm and not more than 18 nm.

Figure 11:
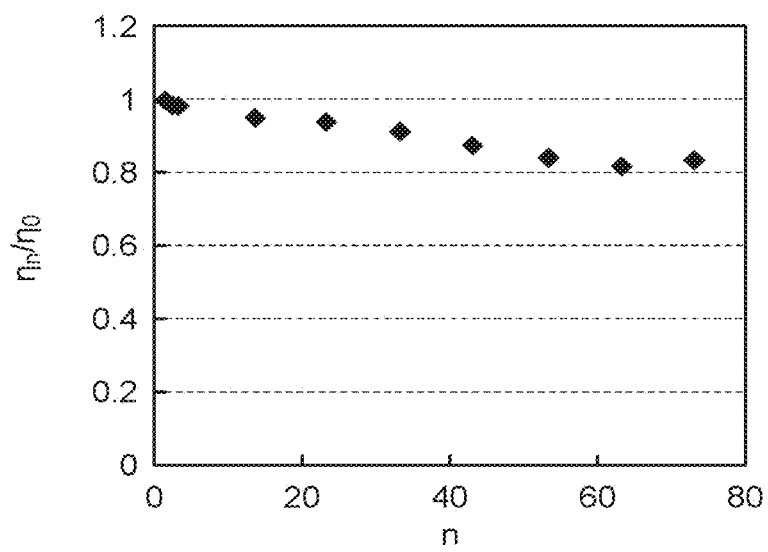
FIG. 11 is a graph showing a characteristic of the photoelectric conversion element according to the embodiment.
Figure 12:
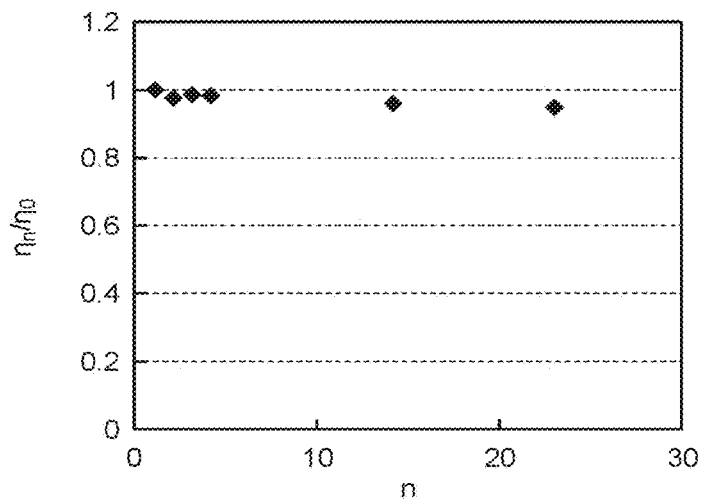
FIG. 12 is a graph showing a characteristic of the photoelectric conversion element according to the embodiment.

FIG. 11 and FIG. 12 are graphs showing characteristics of the photoelectric conversion element according to the embodiment.

In the example shown in FIG. 11, the thickness of the first layer 11 of the photoelectric conversion element 100 is 18 nm. In the example shown in FIG. 12, the thickness of the first layer 11 of the photoelectric conversion element 100 is 2 nm.

The horizontal axis of FIG. 11 and the horizontal axis of FIG. 12 show the number n of measurements of the characteristic of the photoelectric conversion element. The vertical axis of FIG. 11 and the vertical axis of FIG. 12 show $\eta_n/\eta_0$. Here, $\eta_0$ is the initial conversion efficiency. $\eta_n$ is the conversion efficiency of the nth measurement.

As shown in FIG. 11 and FIG. 12, it can be seen that the conversion efficiency degrades more easily for the photoelectric conversion element in which the thickness of the first layer 11 is 18 nm than for the photoelectric conversion element in which the thickness of the first layer 11 is 2 nm. Also, it can be seen that for each photoelectric conversion element, the conversion efficiency gradually approaches some value (e.g., saturation) as the measurements are repeated.

Figure 13A:
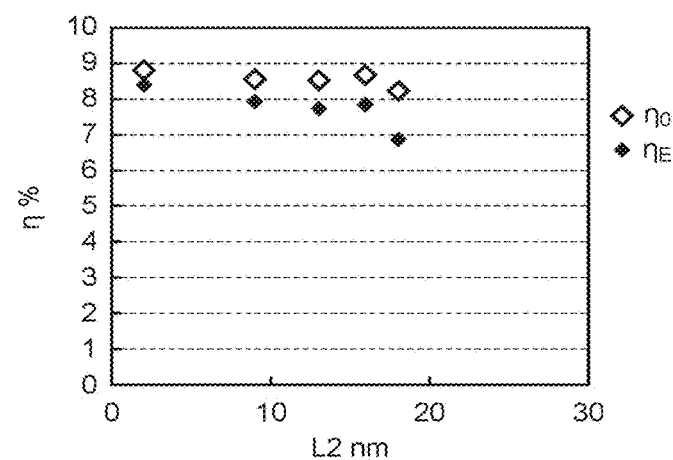
FIG. 13A and FIG. 13B are graphs showing characteristics of the photoelectric conversion element according to the embodiment.
Figure 13B:
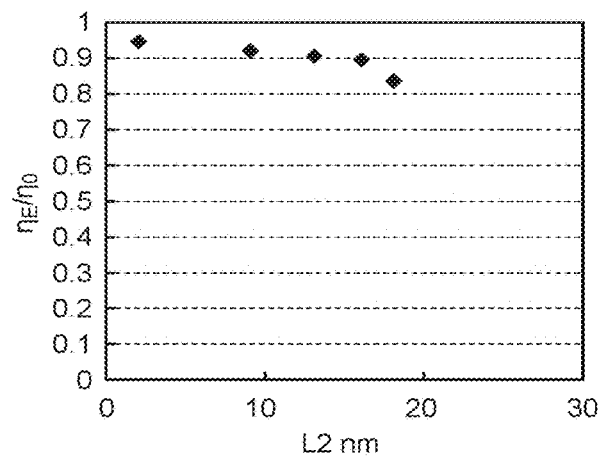

FIG. 13A and FIG. 13B are graphs showing characteristics of the photoelectric conversion element according to the embodiment.

FIG. 13A shows the conversion efficiency no and the conversion efficiency $\eta_E$ when the thickness L2 of the first layer 11 of the photoelectric conversion element 100 according to the embodiment is changed. The conversion efficiency $\eta_0$ is the initial conversion efficiency of each photoelectric conversion element. The conversion efficiency $\eta_E$ is the value that the conversion efficiency gradually approaches as the measurements of each photoelectric conversion element are repeated.

FIG. 13B shows the ratio $\eta_E/\eta_0$ of the conversion efficiency no and the conversion efficiency $\eta_E$ shown in FIG. 13A. $\eta_E/\eta_0$ decreases as the thickness of the first layer 11 increases. In other words, the decrease with respect to the initial conversion efficiency increases as the thickness of the first layer 11 increases. In the embodiment, it is more favorable for the first layer 11 to be not less than 2 nm and not more than 9 nm so that $\eta_E/\eta_0$ is 0.1 or less. Thereby, a stable conversion efficiency can be obtained. Both a high conversion efficiency and high durability can be realized.

FIG. 14 and FIG. 15 are transmission electron microscope images showing cross sections of a photoelectric conversion element.

In FIG. 14, the photoelectric conversion element 119 is observed using a method similar to that of FIG. 4. In the photoelectric conversion element 119 illustrated here, compared to the photoelectric conversion element 100 according to the embodiment described above, the thickness of the first layer 11 is extremely thick. In the formation of the first layer 11 of the photoelectric conversion element 119, the weight percent concentration of zinc in the zinc oxide precursor solution is adjusted to 10%; and spin coating is performed. Otherwise, the formation of the photoelectric conversion element 119 is similar to the formation of the photoelectric conversion element 100.

FIG. 15 shows an enlarged portion of the first layer 11 of the image shown in FIG. 14. The orientation plane Fa of the crystal is observed in the photoelectric conversion element 119 as well. However, in the case where the first layer 11 is thick, the length in the major-axis direction of the crystal grain is not longer than the thickness of the first layer 11. In the embodiment, the thickness of the first layer 11 is set to be in the range described above. Thereby, L1>L2 is obtained.

Figure 16:
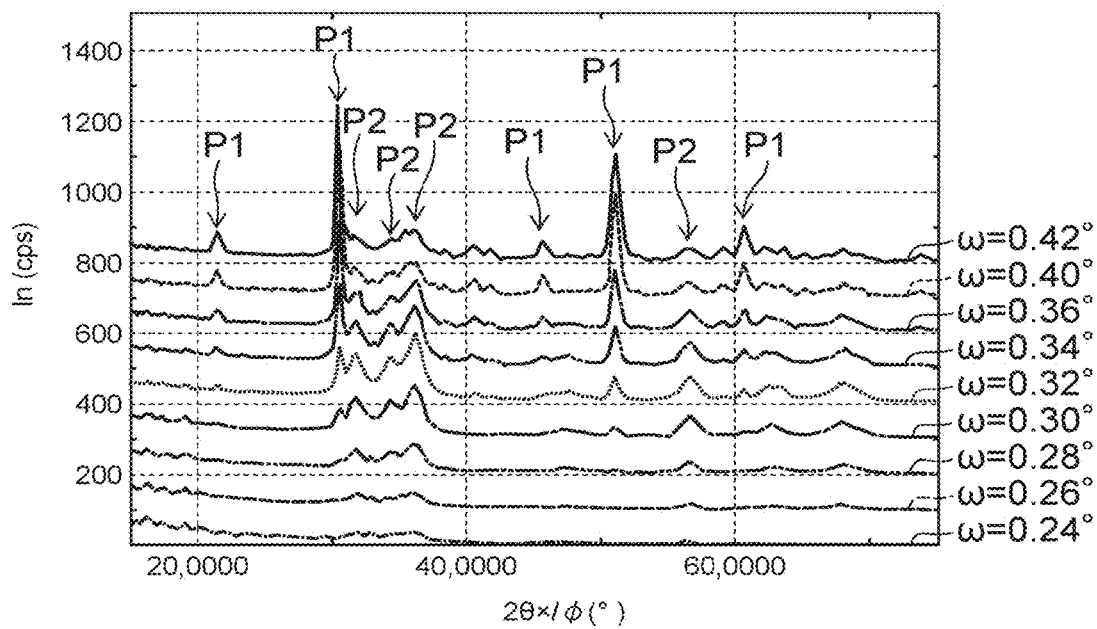
FIG. 16 is a graph showing a result of a XRD measurement.
Figure 17:
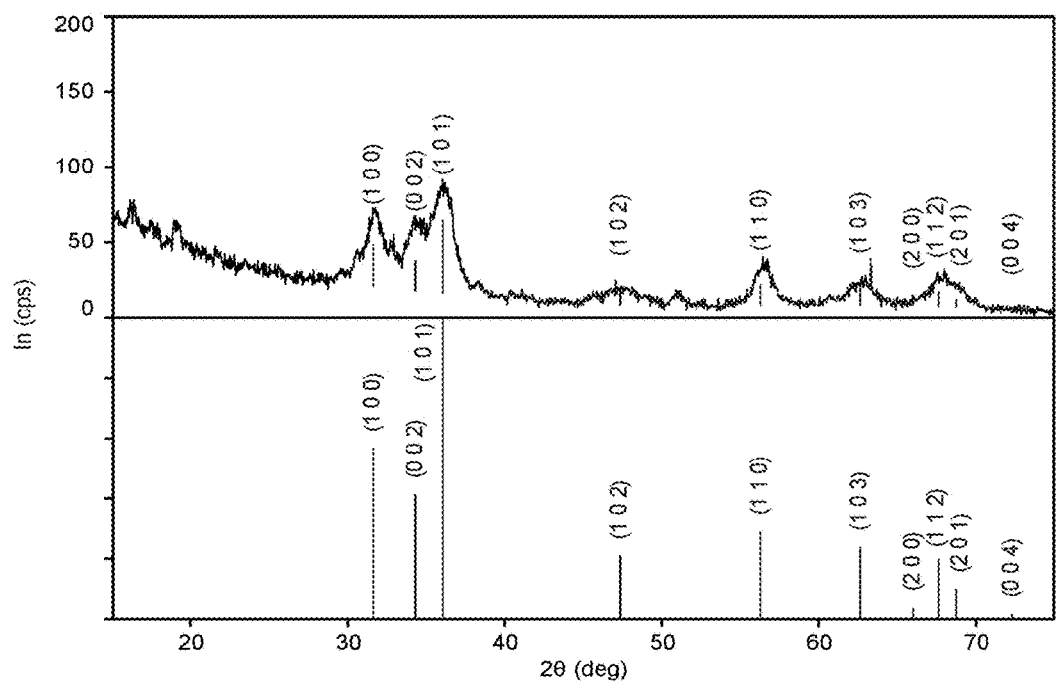
FIG. 17 is a graph showing a result of a XRD measurement.
Figure 18:
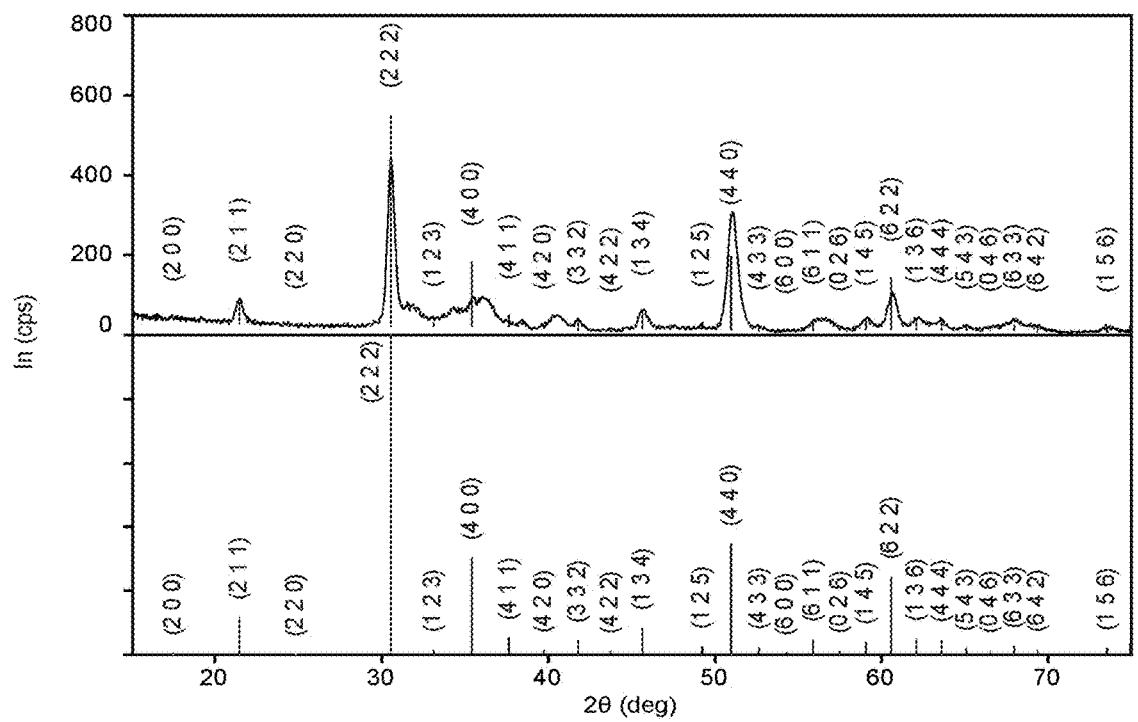
FIG. 18 is a graph showing a result of a XRD measurement.

FIG. 16 to FIG. 18 show X-ray analysis (X-ray diffraction (XRD)) data of the first layer 11. In FIG. 16 to FIG. 18, the vertical axis is an intensity In (cps); and the horizontal axis is an angle $2\theta(°)$. The results of changing an incident angle $\omega$ from 0.24° to 0.42° are displayed together in FIG. 16. The data shown in FIG. 16 can be measured from the sample in which the second electrode 20 and the second layer 12 are peeled from the photoelectric conversion element 100. Although the peeling method is not particularly limited, peeling of the layers from the active layer to the Ag electrode can be performed easily by immersing in a solvent that dissolves the active layer, e.g., chlorobenzene, dichlorobenzene, THF, etc. An in-plane method is used in the XRD measurements. The apparatus that was used was SmartLab made by the Rigaku Corporation. CuK α rays (in a parallel optical system with a divergence angle of about 0.04°) were used as the X-ray source; and the output was set to 45 kV and 200 mA.

The materials included in the sample are identified in FIG. 17 and FIG. 18. In FIG. 17, the incident angle $\omega=0.28°$; and in FIG. 18, the incident angle $\omega=0.42°$.

The upper level of FIG. 17 is the intensity spectrum of the X-ray analysis shown in FIG. 16; and the lower level of FIG. 17 is the intensity spectrum of the X-ray analysis of ZnO. It can be seen from FIG. 17 that the first layer 11 includes ZnO.

The upper level of FIG. 18 is the intensity spectrum of the X-ray analysis shown in FIG. 16; and the lower level of FIG. 18 is the intensity spectrum of the X-ray analysis of ITO. It can be seen from FIG. 18 that the first electrode 10 includes ITO.

In other words, in FIG. 16, peaks P1 are the peaks caused by ITO; and peaks P2 are the peaks caused by ZnO. In the example, the first electrode 10 includes ITO. Therefore, it is considered that the first layer 11 includes zinc oxide. For example, the crystal regions 11c described in reference to FIG. 4 and FIG. 5 are crystals of zinc oxide. In the case where the first layer 11 and/or the first electrode 10 is too thin, a sufficient detection sensitivity may not be obtained. In such a case, it is necessary to increase the sensitivity by increasing the output of the X-ray source.

It is known that the size of the crystal can be evaluated from the width of the diffraction peak of XRD by using the Scherrer equation. The Scherrer equation is $D=K\cdot\lambda/(\beta\cdot\cos\theta)$. In the Scherrer equation, D is the crystallite diameter (□); K is a constant=0.94; λ is the wavelength (m) of X-rays; β is the width at half maximum (2θ); and θ is the Bragg angle of the diffraction line. In this case, λ was 1.54 □.

β is expressed by $\beta=((\text{width at half maximum of the sample})^2-(\text{the instrument function})^2)^{(1/2)}$. β is 1.67° when the width at half maximum of the sample is 1.7 from FIG. 16 and the instrument function is 0.29. D is 5.2 nm when θ is 18.15. In the case where the instrument function is unknown, β may be the width at half maximum of the sample. The value of D was greatly shifted from 10 nm, i.e., the length of the orientation plane Fa of FIG. 15. The Scherrer equation is the relationship when the crystal has a cubic crystal system and the exterior form of the crystal grain is cubic. Moreover, the size of the crystal and the actual length of the orientation plane could not be calculated by XRD.

Figure 19:
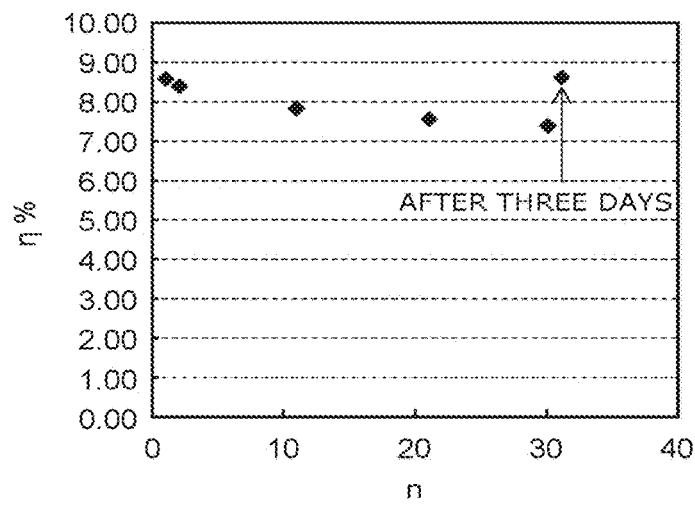
FIG. 19 is a graph showing a characteristic of the photoelectric conversion element according to the embodiment.

FIG. 19 is a graph showing a characteristic of the photoelectric conversion element according to the embodiment.

The element was made similarly to the example shown in FIG. 10 so that the thickness of the first layer 11 was 18 nm. As shown in FIG. 19, the conversion efficiency decreases as the completed element is measured multiple times. The conversion efficiency reached saturation as the measurements were repeated. After saturation, storage in a dark location for 3 days was performed. When measured again, the conversion efficiency had returned to its original value. It can be seen that the charge that was stored in traps originating in the first layer 11 has detrapped. This result suggests that the carriers were trapped.

According to the embodiment, a photoelectric conversion element and a method for manufacturing the photoelectric conversion element having a high conversion efficiency can be provided.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the first electrode, the second electrode, the photoelectric conversion layer, the first layer, the second layer, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All photoelectric conversion elements and methods for manufacturing photoelectric conversion elements practicable by an appropriate design modification by one skilled in the art based on the photoelectric conversion element and the method for manufacturing the photoelectric conversion element described above as embodiments of the invention are within the scope of the invention to the extent that the spirit of the invention is included.

Various modifications and alterations within the spirit of the invention will be readily apparent to those skilled in the art; and all such modifications and alterations should be seen as being within the scope of the invention.

Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A photoelectric conversion element, comprising:
a first electrode;
a second electrode;
a photoelectric conversion layer provided between the first electrode and the second electrode; and
a first layer provided between the first electrode and the photoelectric conversion layer, the first layer including at least a first metal oxide,
the first layer having a plurality of orientation planes,
at least one of the orientation planes satisfying the relationship L1>L2, where L1 is a length of the one of the plurality of orientation planes along a direction crossing a first direction, and L2 is a thickness of the first layer along the first direction, the first direction being from the first electrode toward the second electrode,
the first layer including a first surface and a second surface, the second surface being positioned between the first electrode and the first surface, and
the first surface being flatter than the second surface.

2. The element according to claim 1, wherein
one end of the one of the orientation planes contacts the first electrode, and
one other end of the one of the orientation planes contacts the photoelectric conversion layer.

3. The element according to claim 1, wherein each of the plurality of orientation planes is tilted with respect to the first direction.

4. The element according to claim 1, wherein the thickness of the first layer is not less than 2 nanometers and not more than 18 nanometers.

5. The element according to claim 1, wherein the thickness of the first layer is not less than 2 nanometers and not more than 9 nanometers.

6. The element according to claim 1, wherein the first metal oxide includes at least zinc oxide.

7. The element according to claim 1, further comprising a second layer provided between the second electrode and the photoelectric conversion layer, the second layer including at least a second metal oxide.

8. The element according to claim 7, wherein the second metal oxide includes at least vanadium oxide.

9. The element according to claim 7, wherein a thickness along the first direction of the second layer is 10 nanometers or more.

10. The element according to claim 1, wherein the plurality of orientation planes is arranged periodically.

11. The element according to claim 6, wherein the zinc oxide includes at least one selected from $ZnO_{n1}R$, $ZnO(H_2O)R$, and $ZnO(OH)_{n2}R$, and wherein the R is an alkyl chain.

12. The element according to claim 1, wherein
one end of the one of the orientation planes contacts the first surface, and
one other end of the one of the orientation planes contacts the second surface.

13. The element according to claim 6, wherein
the zinc oxide includes at least one selected from $ZnO_{n1}R$, $ZnO(H_2O)R$, and $ZnO(OH)_{n2}R$, and
the R is —$C_2H_5$, —$CH_3$, —CO—$C_2H_5$, or —CO—$CH_3$.

14. The element according to claim 1, wherein
the second electrode includes a first portion, a second portion, and a third portion connecting the first portion and the second portion,
a direction from the first electrode to the first portion being along the first direction,
a direction from the first electrode to the second portion being along a second direction perpendicular to the first direction, a material of the second portion is same as a material of the third portion, and the photoelectric conversion layer is provided between the first electrode and the first portion.

* * * * *